(12) United States Patent
Bagger et al.

(10) Patent No.: US 9,374,056 B2
(45) Date of Patent: Jun. 21, 2016

(54) MULTIBAND RF DEVICE

(71) Applicant: Intel Deutschland GmbH, Neubiberg (DE)

(72) Inventors: Oluf Bagger, Aalborg (DK); Bernd Adler, Neubiberg (DE); Mikael Bergholz Knudsen, Gistrup (DK); Michael Wilhelm, Mammendorf (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

(21) Appl. No.: 14/526,604

(22) Filed: Oct. 29, 2014

(65) Prior Publication Data
US 2015/0119115 A1  Apr. 30, 2015

Related U.S. Application Data

(63) Continuation of application No. 12/618,812, filed on Nov. 16, 2009, now abandoned.

(51) Int. Cl.
*H04M 1/00* (2006.01)
*H03G 3/30* (2006.01)
*H04B 1/00* (2006.01)
*H04B 1/58* (2006.01)
*H04L 5/14* (2006.01)

(52) U.S. Cl.
CPC ........... *H03G 3/3042* (2013.01); *H04B 1/0057* (2013.01); *H04B 1/58* (2013.01); *H04L 5/14* (2013.01)

(58) Field of Classification Search
CPC ...................................................... H04B 1/006
USPC ................ 455/83, 552.1, 125, 112, 118, 120
See application file for complete search history.

(56) References Cited

U.S. PATENT DOCUMENTS

| | | | |
|---|---|---|---|
| 7,006,032 B2 | 2/2006 | King et al. | |
| 7,676,243 B2 | 3/2010 | Leinonen et al. | |
| 7,884,680 B2 * | 2/2011 | Raidl et al. | 331/167 |
| 7,937,093 B2 * | 5/2011 | Feher | 455/456.1 |
| 7,945,229 B2 * | 5/2011 | Wilson et al. | 455/296 |
| 2007/0021080 A1 | 1/2007 | Kuriyama et al. | |
| 2007/0064833 A1 | 3/2007 | Sahota | |
| 2007/0161357 A1 | 7/2007 | Tudosoiu et al. | |
| 2009/0285135 A1 | 11/2009 | Rousu et al. | |
| 2009/0286569 A1 | 11/2009 | Rousu et al. | |
| 2010/0105340 A1 | 4/2010 | Weissman | |
| 2011/0117862 A1 | 5/2011 | Bagger et al. | |

OTHER PUBLICATIONS

"U.S. Appl. No. 12/618,812, Final Office Action mailed Apr. 27, 2014", 13 pgs.
"U.S. Appl. No. 12/618,812, Final Office Action mailed Jul. 5, 2012", 20 pgs.

(Continued)

*Primary Examiner* — Ping Hsieh
(74) *Attorney, Agent, or Firm* — Schwegman Lundberg & Woessner, P.A.

(57) ABSTRACT

A device or system for transmission and reception for voice or data communication applications. The device or system is capable of duplex operation and adapted to operate in an environment using a plurality of frequency bands. The present disclosure also relates to a communication means including a transmitter and receiver arrangement and to antennas.

19 Claims, 5 Drawing Sheets

(56) References Cited

OTHER PUBLICATIONS

"U.S. Appl. No. 12/613,812, Non Final Office Action mailed Jul. 5, 2013", 22 pgs.

"U.S. Appl. No. 12/618,312, Non Final Office Action mailed Oct. 23, 2011", 17 pgs.

"U.S. Appl. No. 12/618,812, Response filed Feb. 23, 2012 to Non Final Office Action mailed Oct. 28, 2011", 14 pgs.

"U.S. Appl. No. 12/618,812, Response filed Nov. 5, 2013", 12 pgs.

"U.S. Appl. No. 12/618,812, Response filed Dec. 5, 2012 to Final Office Action mailed Jul. 5, 2012", 12 pgs.

\* cited by examiner

MULTIBAND RF DEVICE

CLAIM OF PRIORITY

This application is a continuation of and claims the benefit of priority to U.S. patent application Ser. No. 12/618,812, filed Nov. 16, 2009, which is incorporated by reference herein in its entirety.

BACKGROUND

The present disclosure relates to a device for transmission and reception for voice or data communication applications. The device is capable of duplex operation and adapted to operate in an environment using a plurality of frequency bands. The present disclosure also relates to a communication means including a transmitter and receiver arrangement and antennas.

Certain mobile telephone applications such as UMTS require an arrangement having a transmitter and a receiver able to operate in full duplex mode, i.e. that transmitter and receiver are simultaneously active. The transmitter and the receiver use a plurality of frequency bands, each frequency band dedicated to voice and/or data transmission in one direction. In the arrangement of interest, transmission and reception may occur over multiple frequency bands, and the mobile system may be capable of operating both in half-duplex and in full-duplex modes.

Receiver sensitivity, for example signal-to-noise ratio, in a full-duplex operation is degraded by a transmit "noise" signal, i.e. unwanted signal, in the receive frequency band. A requirement in such arrangements, therefore, is to reduce transmit noise at the receiver, preferably by attenuation to below the level of thermal noise inherent in any electronic circuitry.

A frequency band is a small portion of radio communication frequency spectrum, in which channels are aside for different telephony systems, such as GSM or UMTS. Each of these bands has a basic scheme set by ETSI which dictates how it is to be used and shared, to avoid interference and to set the protocol for compatibility of transmitters and receivers.

The power amplifier is the final amplification circuit portion adapted to drive the transmission signals destined for the antenna. A power amplifier expends silicon area, and causes power consumption. Power amplifiers may be either separate circuits, or integrated into a common substrate along with other transmitter circuitry.

Selected attenuation at the receiver is achieved by using a directional filter such as a circulator with a frequency filtering characteristic. In some cases, no low-Q filter on the output of the power amplifier is needed. A diplex filter connects the output to the antenna. Filters and power amplifiers take a lot of chip space and require many process steps in manufacturing. It is therefore desirable to reduce the number of filters, and the number of power amplifiers, while maintaining the capability of full duplex operation over multiple frequency bands.

In various aspects, the invention is defined in the independent claims. The dependent claims define various embodiments of the invention.

In one aspect of the invention, the transmitter and receiver arrangement is adapted for connection to one or more antennas, and is capable of full-duplex communication. In the transmitter and receiver arrangement the number of power amplifiers is fewer than the number of frequency bands. In an embodiment of the invention, the device is adapted for operation in a plurality of frequency bands, and comprises a wide-band tunable modulation stage adapted for providing signals over the plurality of frequency bands, a first filter, comprising frequency selective elements selective for each of the plurality of frequency bands to receive a transmission signal from the wide-band tunable modulation stage and to provide a filtered signal, and a final power amplifier stage adapted to receive the filtered signal, wherein the signal is directed from the wide-band tunable modulation stage through the first filter to the final power amplifier stage.

In an embodiment of the transmitter and receiver arrangement according to the invention the arrangement is such that there is no high-Q filter element in a transmit path between the power amplifiers and the antenna used for transmission. In an embodiment there is no filter element between the power amplifier and an antenna connection in the arrangement.

"High-Q" in this context refers to filters with a high Q factor, i.e. a high quality factor, as a dimensionless parameter that gives a measure of the 'quality' desired in a particular tuned circuit. An example of a high-Q filter is a Surface Acoustic Wave or SAW filter, based on a piezoelectric crystal. Other examples of high-Q filters include Bulk Acoustic Wave (BAW) filters, ceramic filters, and composite "metafilters". A high Q, for the purposes of the description of the present invention, is understood to be typically a value well over 20.

In an embodiment the final power amplification stage has significantly less than 30 dB gain. This has the effect of reducing the need for filtering the signal at the output of the power amplifier. For example, the final power amplifier stage's gain is less than 25 dB, or even less than 20 dB, or even less than 15 dB.

An embodiment comprises a power amplifier with a gain of, for example, in the range of 10 dB. This contributes to achieving an arrangement wherein there is no high-Q filter at the output of the power amplifier. It may also permit the arrangement to do without duplex filters after the power amplification stage, which in turn has advantages of simple design, improved power efficiency, and thereby reduced cost.

In another embodiment the filter configuration comprises high-Q frequency filters preceeding the final power amplification stage. This has the advantage of reducing the requirements for filtering after the power amplification stage.

In another embodiment, a filter with directional attenuation characteristics is disposed between the transmitter and the receiver. This allows signals from the transmitter, destined for the antenna, to be separated from signals received from the antenna and destined for the receiver. In one embodiment, the filter with directional attenuation characteristics is disposed on a signal path for coupling the antenna to the transmitter and to the receiver.

Yet another embodiment features attenuation between transmitter and receiver which is achieved by using multiple narrow-band filters with directional attenuation characteristics, each adapted to operate on one or more of the frequency bands used for duplex operation.

According to another aspect of the invention, there is provided a method for duplex signal transmission and reception in mobile communication. The method includes:

operating a transmitter and receiver arrangement in a plurality of frequency bands, amplifying the signal using power amplifiers in a final power amplifier stage of the transmitter and receiver arrangement, wherein the number power amplifiers in the final power amplifier stage is fewer than the number of frequency bands in the plurality of frequency bands, and filtering an amplified signal using a filter configuration without high-Q frequency filters following the final power amplification stage.

By using power amplifiers in a final power amplifier stage of the transmitter and receiver arrangement, wherein the number power amplifiers in the final power amplifier stage is fewer than the number of frequency bands in the plurality of frequency bands, the method achieves performance sufficient for UMTS operation at lower power consumption. In particular, coupling of the amplified signal on the transmit signal path into a receive path is acceptably low.

By using a filter configuration without high-Q filters following the final power amplification stage, the method achieves a simpler routing of the signal path between transmitter and antenna, and lower power consumption.

In an embodiment, the method uses a circulator to achieve selective attenuation. The circulator directs a maximum of signal from the transmitter to the connection to an antenna and from the connection to the antenna to the receiver, while allowing little signal to pass from the transmitter to the receiver.

In an embodiment, the method uses multiple circulators, each adapted to a group of one or more of the frequency bands used for duplex operation. Thus, signals can be separated into groups which further reduces the incidence of signals on the transmit path from the transmitter which pass to the receiver.

BRIEF DESCRIPTION OF THE SEVERAL VIEWS OF THE DRAWINGS

The figures show selected exemplary embodiments of the invention. In particular.

DETAILED DESCRIPTION

Figure 1:
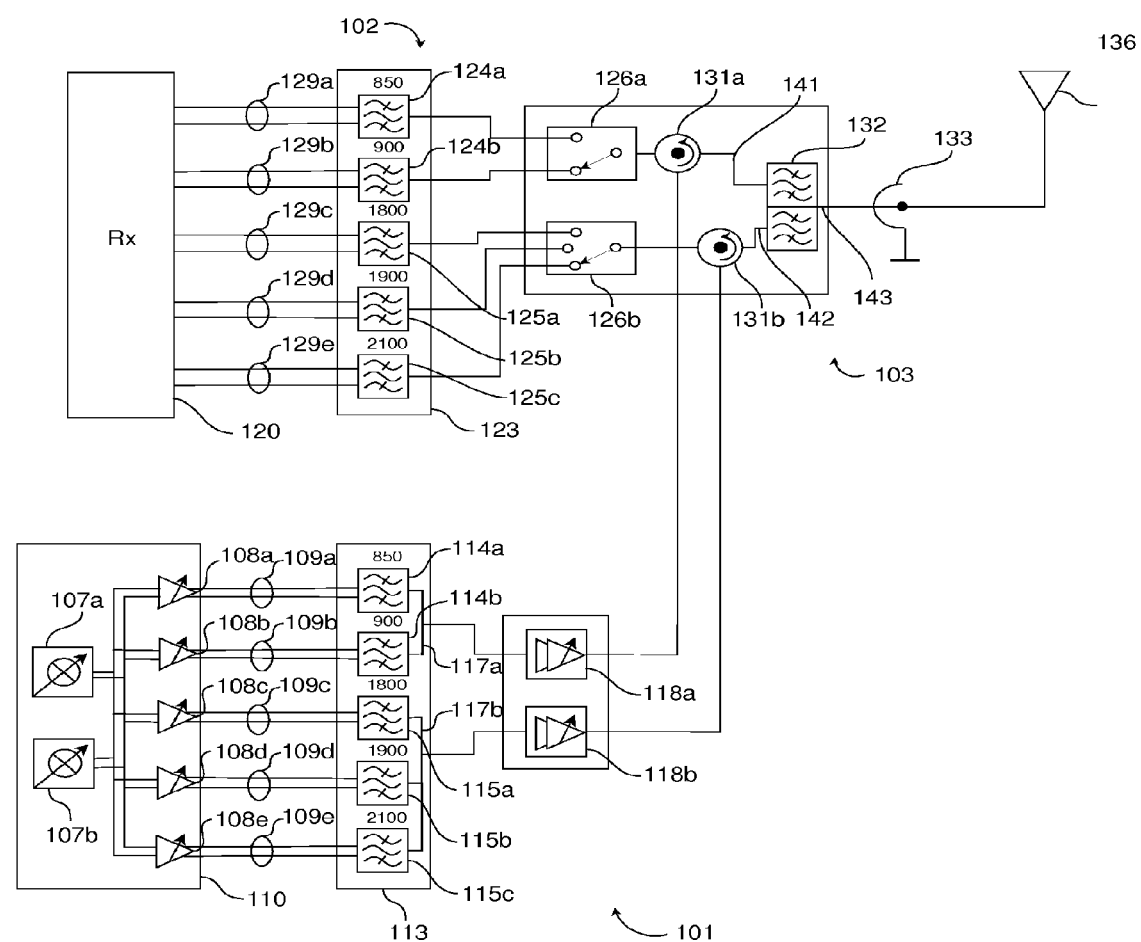
FIG. 1 shows a first embodiment with two circulators each at a connection point on a signal path coupling transmitter, receiver, and an antenna connected to the arrangement.

The following detailed description explains exemplary embodiments of the present invention. The description is not to be taken in a limiting sense, but is made only for the purpose of illustrating the general principles of embodiments of the invention while the scope of protection is only determined by the appended claims.

In the exemplary embodiments shown in the drawings and described below, any direct connection or coupling between functional blocks, devices, components or other physical or functional units shown in the drawings or described herein can generally also be implemented by an indirect connection or coupling. Functional blocks may be implemented in hardware, firmware, software, or a combination thereof.

Further, it is to be understood that the features of the various exemplary embodiments described herein may be combined with each other, unless specifically noted otherwise.

In the various figures, identical or similar entities, modules, devices etc. may have assigned the same reference number.

A preferred first embodiment of the invention is shown in FIG. 1. Embodiments of the invention, such as the first embodiment, could be implemented, for example, in a mobile phone. The first embodiment comprises an arrangement of a transmit circuitry portion 101 and a receive circuitry portion 102. Further the embodiment has a passive portion 103 connected to an antenna 136. The transmit circuitry portion 101 is coupled to the passive portion 103. The passive portion 103, via an antenna feed line 135, connects to the antenna 136 and is also coupled to the receive circuitry portion 102.

Transmit circuitry portion 101 comprises a transmitter 110, a transmit filter element bank 113, and a pair of power amplifiers 118a, 118b. The power amplifiers 118a, 118b are identified as the last active amplification circuitry on the transmit signal path to the antenna.

Transmitter 110 is of a conventional type and comprises wide-band tunable modulation stages 107a, 107b and low power preamplifiers 108a, 108b, 108c, 108d, 108e each adapted to operate in a different frequency band, i.e., at 850, 900, 1800, 1900 and 2100 MHz, respectively. Differential output line pairs 109a, 109b, 109c, 109d, 109e, each associated to a respective one of the afore-mentioned frequency bands, connect transmitter 110 to transmit selective band filter element bank 113.

Transmit filter element bank 113 comprises a low-band group of filter elements including a first filter element 114a and a second filter element 114b adapted to operate in the frequency band of 850 MHz and 900 MHz, respectively. Transmit filter element bank 113 comprises a high-band group of filter elements including a third filter element 115a, a fourth filter element 115b, and fifth filter element 115c adapted to operate in the frequency band of 1800 MHz, 1900 MHz and 2100 MHz, respectively. Each filter element 114a, 114b; 115a, 115b, 115c receives a different one of the differential output line pairs 109a, 109b, 109c, 109d, 109e, respectively. Outputs of filter elements 114a and 114b of the low-band group of filter elements are connected to one another to form a low-band common filter element output 117a. Outputs of filter elements 115a, 115b and 115c of the high-band group of filter elements are connected to one another to form a high-band common filter element output 117b. Thus, low-band common filter element output 117a and high-band common filter element output 117b form a pair of filter bank outputs.

The pair of power amplifiers comprises low-band power amplifier 118a and high-band power amplifier 118b. An input of low-band power amplifier 118a is connected, via a connection from filter bank output 117a, to transmit filter element bank 113. An output of low-band power amplifier 118a is connected to the passive portion 103. An input of high-band power amplifier 118b is connected, via a connection from transmit filter element bank output 117b, to transmit filter element bank 113. An output of high-band power amplifier 118b is connected to the passive portion 103.

Receive circuitry portion 102 comprises a receive filter element bank 123 and a receiver 120 of a conventional type. Receive filter element bank 123 comprises a low-band group of filter elements including a first filter element 124a and a second filter element 124b adapted to suppress signals outside and to operate in the frequency band of 850 MHz and 900 MHz, respectively. Receive filter element bank 123 comprises a high-band group of filter elements including a third filter element 125a, a fourth filter element 125b, and fifth filter element 125c adapted to suppress signals outside and to operate in the frequency band of 1800 MHz, 1900 MHz and 2100 MHz, respectively. Each filter element 124a, 124b; 125a, 125b, 125c receives a different one of five input lines as a connection from the passive portion 103. Differential output line pairs 129a, 129b, 129c, 129d, 129e connect the filter elements 124a, 124b; 125a, 125b, 125c of receive filter element bank 123 to receiver 120. Receiver 120 comprises low power active circuitry portions (not shown) each adapted to operate in a different frequency band, i.e., at 850, 900, 1800, 1900 and 2100 MHz, respectively, and each being coupled to a corresponding differential output line pair 129a, 129b, 129c, 129d, 129e.

Passive portion 103 comprises a low-band circulator 131a, a high-band circulator 131b, a low-band band switch 126a and a high-band band switch 126b, a diplex filter 132, and an antenna connection 133. A circulator is a directional filter. A typical circulator offers up to 20 dB attenuation in the "backwards" direction but only a few dB in the "forward" direction.

Low-band circulator 131a and high-band circulator 131b have each three terminals wherein the terminals can be accessed in such a way that when a signal is fed into any terminal it is transferred to the next terminal only, the first terminal being counted as following the last in numeric order. A first terminal of low-band circulator 131a is coupled to the output of low-band power amplifier 118a. A second terminal of low-band circulator 131a is coupled to a first terminal 141 of diplex filter 132. A third terminal of low-band circulator 131a is coupled to an input of low-band band switch 126a. A first terminal of high-band circulator 131b is coupled to the output of high-band power amplifier 118b. A second terminal of high-band circulator 131b is coupled to a second terminal 142 of diplex filter 132. A third terminal of high-band circulator 131b is coupled to an input of high-band band switch 126b.

Low-band band switch 126a comprises a single pole switch adapted to select between two connections from the third terminal of low-band circulator 131a either to first low-band filter element 124a or to second low-band filter element 124b. High-band band switch 126b comprises a single pole switch adapted to select between three connections from the third terminal of high-band circulator 131b either to first high-band filter element 125a or to second high-band filter element 125b or to third high-band filter element 125c.

Diplex filter 132 is connected, via a third terminal 143, to antenna connection 133. The diplex filter 132 has a signal path that comprises a low-pass filter and a high-pass filter. The low-pass filter and the high-pass filter both do not have a high quality factor; the combination presents an insertion loss sufficiently small to allow a transmit signal passing through the filter to transmitted while suppressing effectively cross coupling of signals from the low-frequency band to the high-frequency band and vice versa.

In operation of the first embodiment, a baseband signal representing, for example, user speech information or data to be transferred, is provided to the transmit circuitry portion 101 for transmission. In particular, the baseband signal is input to transmitter 110 where the baseband signal modulates a radio frequency signal generated in one of the low power wide-band tunable modulation stages 107a, 107b circuitry portions, the portion being selected such that the frequency of the radio frequency signal is inside a frequency band designated by user's mobile phone operator for communication.

The radio frequency signal henceforth defines a transmit signal path extending through the transmit circuitry portion 101 and the passive portion 103 to antenna 136. In particular, the radio frequency signal is outputted from one of the low power preamplifiers 108a, 108b, 108c, 108d, 108e of transmitter 110, via a corresponding one of the differential output line pairs 109a, 109b, 109c, 109d, 109e. The signal travels to filter element bank 113 where it is coupled to the respective filter element 114a, 114b; 115a, 115b, 115c associated with the selected frequency's designated frequency band. The respective filter element suppresses signal components outside the designated frequency band. Thereby, the radio frequency signal is cleared of undesired components.

Depending on whether the radio frequency signal passes through one of the low-band group filter elements 114a and 114b or through one of the high-band group of filter elements 115a, 115b, 115c, the filtered radio frequency signal leaves filter element bank 113 either via low-band common filter element output 117a or via high-band common filter element output 117b and is coupled to the input of low-band power amplifier 118a or to the input of high-band power amplifier 118b, respectively. Depending on whether the filtered radio frequency signal is a low-band or a high-band signal, either the low-band power amplifier 118a or the high-band power amplifier 118b provides, at its output, the radio frequency signal sufficiently amplified for passing the circulator 131a or 131b, respectively, and the diplex filter 132 to then be transmitted by antenna 136. Thus, the amplification in the respective power amplifier 118a, 118b may be less than in a case where a filter having a high Q factor is positioned in place of the diplex filter 132. In a variant of the present embodiment, the low-band amplifier and the high-band amplifier could simultaneously amplify a low-band signal and a high-band signal, respectively, to enable simultaneous transmission of both the low-band signal and the high-band signal.

The amplified radio frequency signal travels from the power amplifiers' respective output to the passive portion 103. In the passive portion 103, the amplified radio frequency signal, if within the low band, enters low-band circulator 131a via the first terminal and leaves low-band circulator 131a via the second terminal. If the radio frequency signal is within the high band, the radio frequency signal enters high-band circulator 131b via the second terminal and leaves high-band circulator 131b via the third terminal. In comparison with the radio frequency signal output via the third terminal of circulator 131a, 131b, a much attenuated radio frequency signal may occur at the first terminal of circulator 131a, 131b as well. In the given example, the attenuation is more than 10 dB and up to about 20 dB and is not necessarily the same in low-band circulator 131a and in high-band circulator 131b.

The low-band radio frequency signal travels from the second terminal of low-band circulator 131a to the first terminal of the diplex filter 132. The high-band radio frequency signal travels from the second terminal of the high-band circulator 131b to the second terminal of the diplex filter 132. The radio frequency signal passes through diplex filter 132 and is output from diplex filter 132 at the third terminal 143. The radio frequency signal then travels via antenna connection 133 to antenna 136 that radiates the radio frequency signal. A signal received at the antenna 136, in operation, defines a receive signal path that extends from the antenna 136 through the passive portion 103 and into the receive circuitry portion 102. The signal from antenna 136 first passes through the antenna connection 133 and then to the third terminal 143 of the diplex filter 132. The diplex filter 132 passes a low-band portion of the signal through to the first terminal of the diplex filter. From there, the low-band portion of the signal, i.e., a low-band signal, is coupled to the second terminal of the low-band circulator 131a. A high-band portion of the signal passes through the diplex filter 132 to the second terminal of the diplex filter 132. From there, the high-band portion of the signal, i.e., a high-band signal, is coupled to the high-band circulator 131b.

The low-band signal leaves low-band circulator 131a via the third terminal and continues to the low-band switch 126a. Depending on user settings, low-band switch 126a in turn directs the signal to filter element 124a for an 850 MHz signal or to filter element 124b for a 900 MHz signal.

The high-band signal leaves high-band circulator 131b via the third terminal and continues to high-band switch 126b. Depending on user settings, high-band switch 126b in turn directs the signal to the filter element 125a for an 1800 MHz signal, 125b for a 1900 MHz signal or filter element 125c for a 2100 MHz signal.

From the respective filter elements of filter element bank 123 the signal passes over the corresponding differential input line pairs 129a, 129b, 129c, 129d, 129e to the receiver 120. If receiver 120 is a conventional type receiver, the receiver 120, for example, will demodulate the signal and down-convert the signal to obtain a baseband signal for further processing.

As shown in the first embodiment (FIG. 1) circulators 131a, 131b with a frequency-specific behavior make it possible to have at least one of the power amplifiers amplifying signals from more than one frequency band. In other words, implementation of circulators 131a, 131b enables consolidation of power amplifiers such that the device comprises fewer power amplifiers in the transmit signal path than there are frequency bands that the device is adapted to operate with. For example, the first embodiment is adapted to operate both in a group of high-band frequencies and a group of low-band frequencies. For each group there is a specific power amplifier of moderate gain, for example 10 dB. The gain is moderate in comparison with a gain of a power amplifier of a conventional arrangement that, for example, includes a power amplifier with a gain of 30 dB. The moderate gain of the power amplifiers 118a, 118b of the present embodiment of the invention is possible because of the low loss in the transmit signal path, in particular down stream of the power amplifiers 118a, 118b. Low loss is achieved by using circulators 131a, 131b. The high-band circulator 131b and the low-band circulator 131a are used, such that no switch is needed between the power amplifiers 118a, 118b and the antenna 136. The circulators 131a, 131b, which are filters with directional attenuation characteristics, allow signals from the transmitter 110, destined for the antenna 136, to be separated from signals received from the antenna 136 and destined for the receiver 120. In this embodiment, the arrangement uses multiple circulators, each adapted to a group of one or more of the frequency bands used for duplex operation. Thus, signals can be separated into groups which further reduces the incidence of signals on the transmit path from the transmitter which pass to the receiver.

The low or moderate gain of the power amplifiers 118a, 118b means that there is no high-Q filter required after these amplifiers, although one could be used. Grouping of the frequencies, i.e., amplifying of signals irrespective of the frequency band within one group by the same power amplifier, yields fewer power amplifiers than the number of frequency bands in the plurality of frequency bands, in this case two amplifiers to be used with five frequency bands. The effect of these measures is to reduce the complexity of the complete arrangement.

Operation over multiple frequency bands, in a variant of the exemplary embodiment, requires that attenuation is achieved between a transmitted signal and a received signal, as seen by the receiver, in order that the received signal is not obscured by the transmitted signal. This becomes less challenging as the separation between the transmit and receive frequency bands increases. Separate bands means that there is a frequency band between those used for transmission and/or reception that is used for neither transmission nor reception in the instant arrangement. The frequency bands might for example be those defined by 3GPP, the 3rd Generation Partnership Project. Attenuation can be achieved in part by a filtering of the transmitted signal after preamplification but prior to the power amplification, or by establishing an attenuation between the paths transmitter-to-antenna and antenna-to-receiver. Duplex filters can achieve as much as 50 dB attenuation in the relevant frequencies, but at high cost due to more challenging manufacturing requirements and due to a 2-3 dB insertion loss.

Placement of high-Q filters before the final Power Amplifier rather than after it leads to lower costs. This can be done if the final Power Amplifier stage has less gain than the overall transmit gain. For example, if the gain from modulator to antenna should be of the order of 30 dB, then the final Power Amplifier might ideally have a gain of 10 dB. In addition, the reduced gain may allow power savings. The gain of the final Power Amplifier stage might be less than 30 dB, or 25 dB or less, or 20 dB or less, or 15 dB or less, or 12 dB or less, or 10 dB or less, or 9 dB or less, or 8 dB or less. The final Power Amplifier stage will also have a gain greater than or equal to 3 dB.

Power consumption is also reduced, by reducing the number of power amplifiers used by the transmitter to transmit over all relevant frequency bands.

Figure 2:
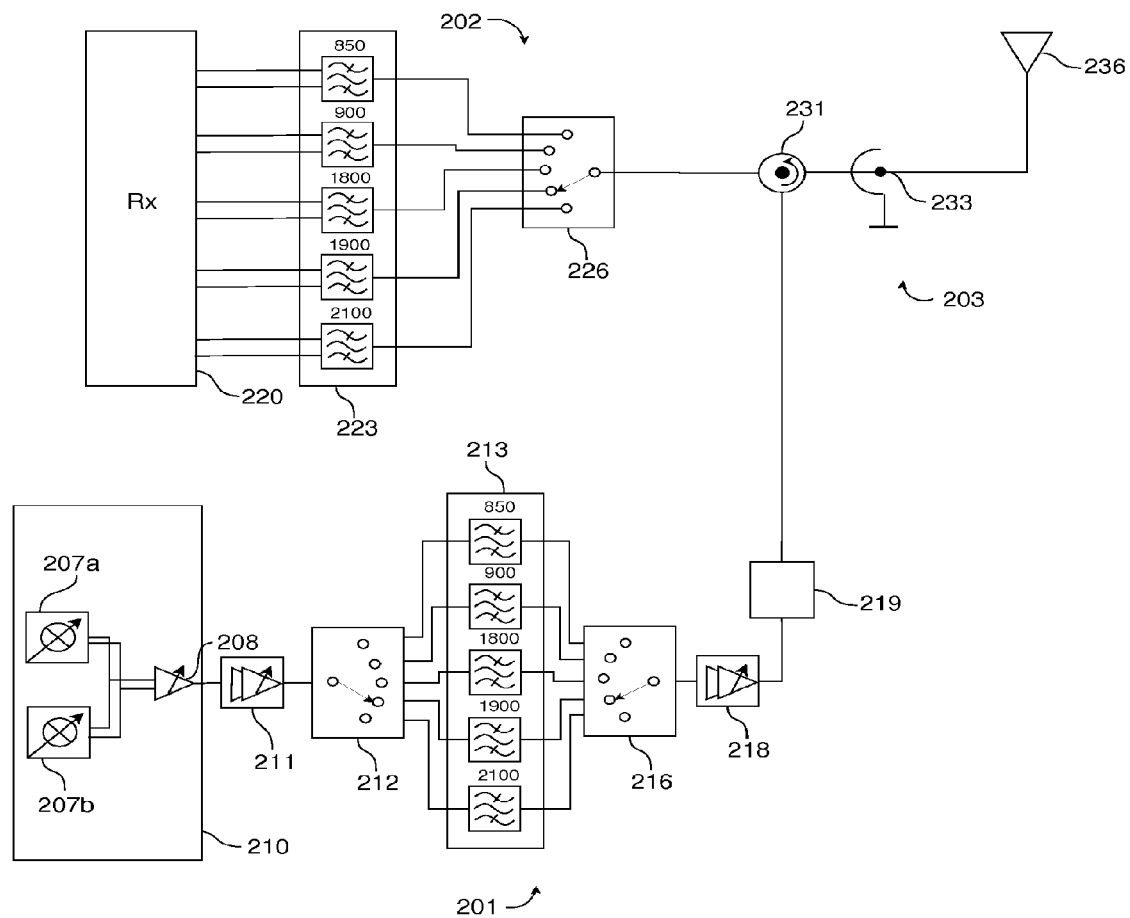
FIG. 2 shows a second embodiment with a single circulator at a connection point on a signal path coupling transmitter, receiver, and an antenna connected to the arrangement.

A second embodiment is presented in FIG. 2. Like the first embodiment, the second embodiment encompasses a transmit circuitry portion 201, a receive circuitry portion 202 and a passive portion 203.

The transmit circuitry portion 201 includes a transmitter 210 adapted to provide a signal in a predetermined and/or selected frequency band comprising wide-band tunable modulation stages 207a, 207b, a pre-power amplifier 211, a switch 212, a transmit selective band filter bank 213, a power amplifier 218 and a tunable filter 219. A transmit signal path to the antenna for all frequencies starts from the transmitter 210 to the pre-power amplifier 211, then through switch 212, transmit bandpass filter bank 213, and the power amplifier 218. The pre-power amplifier 211 is identified as such because, on the transmit signal path, it comes before the power amplifier 218. The switch 212 is adapted to direct the transmit signal path to an element of the frequency band filter bank 213. The transmit signal path then leads from the bandpass filter bank 213 to the switch 216, which is adapted to direct the signal in the selected frequency band to the power amplifier 218. From the power amplifier 218, the transmit signal path leads to the tunable filter 219.

The passive portion 203 includes a circulator 231, an antenna connection 233 and an antenna 236. The passive portion 203 takes the transmit signal path from the tunable filter 219 in the transmit circuit portion 210 to a first terminal of the circulator 231. The signal path then leads from a second terminal of the circulator 231 along the antenna connection 233 to the antenna 236. The passive portion 203 further defines a portion of a receive signal path of the second embodiment that starts at the antenna 236, and leads to the second terminal of the circulator 231.

The receive circuitry portion 202 includes a switch 226, a filter bank 223 including filter elements each adapted to pass a signal in a different selected frequency band and to essentially suppress signals outside the selected frequency band, and a receiver 220. The switch 226 is adapted to direct the receive signal path to the frequency band filter element of interest in the receive bandpass filter bank 223. The signal path then continues from the filter element to the receiver 220.

The second embodiment shares many features with the first embodiment. However, the following is different in the second embodiment: as shown in FIG. 2, only one circulator is used, and a switch 216 is used. The switch 216 is placed upstream of the power amplifier 218. Alternatively the switch 216 could be placed between power amplifier 218 and antenna 236. In the exemplary embodiment the system comprises a transmit preamplifier 211. In the present example, the transmit preamplifier 211 is common to all frequencies. Downstream of the common transmit preamplifier 211 is arranged a switch 212 to direct the transmit signal to a filter 213, wherein the filter 213 is particularly adapted to pass respective frequency bands. Further downstream is arranged the switch 216 to connect the frequency filter 213 to the power amplifier 218.

As in the first embodiment, the power amplifier 218 of the second embodiment has a moderate gain, for example 10 dB. The moderate gain contributes to achieving an arrangement wherein there is no high-Q filter at the output of the power amplifier 218. A low-Q tunable filter 219 is arranged downstream in the transmit path to the circulator 231 and antenna 236. This embodiment also permits the arrangement to function without duplex filters downstream of the power amplification stage, which in turn has advantages of simple design, improved power efficiency, and thereby reduced cost.

The moderate gain or even a low gain of the power amplifier 218, is made possible by the contribution of the transmit preamplifier 211. The moderate gain means that there is no high-Q filter downstream of the power amplifier 218. Selective switching of the frequency band means that there is only one power amplifier 218, which is fewer than the number of frequency bands in the plurality of frequency bands. The effect of these measures is to reduce the complexity of the complete arrangement.

Figure 3:
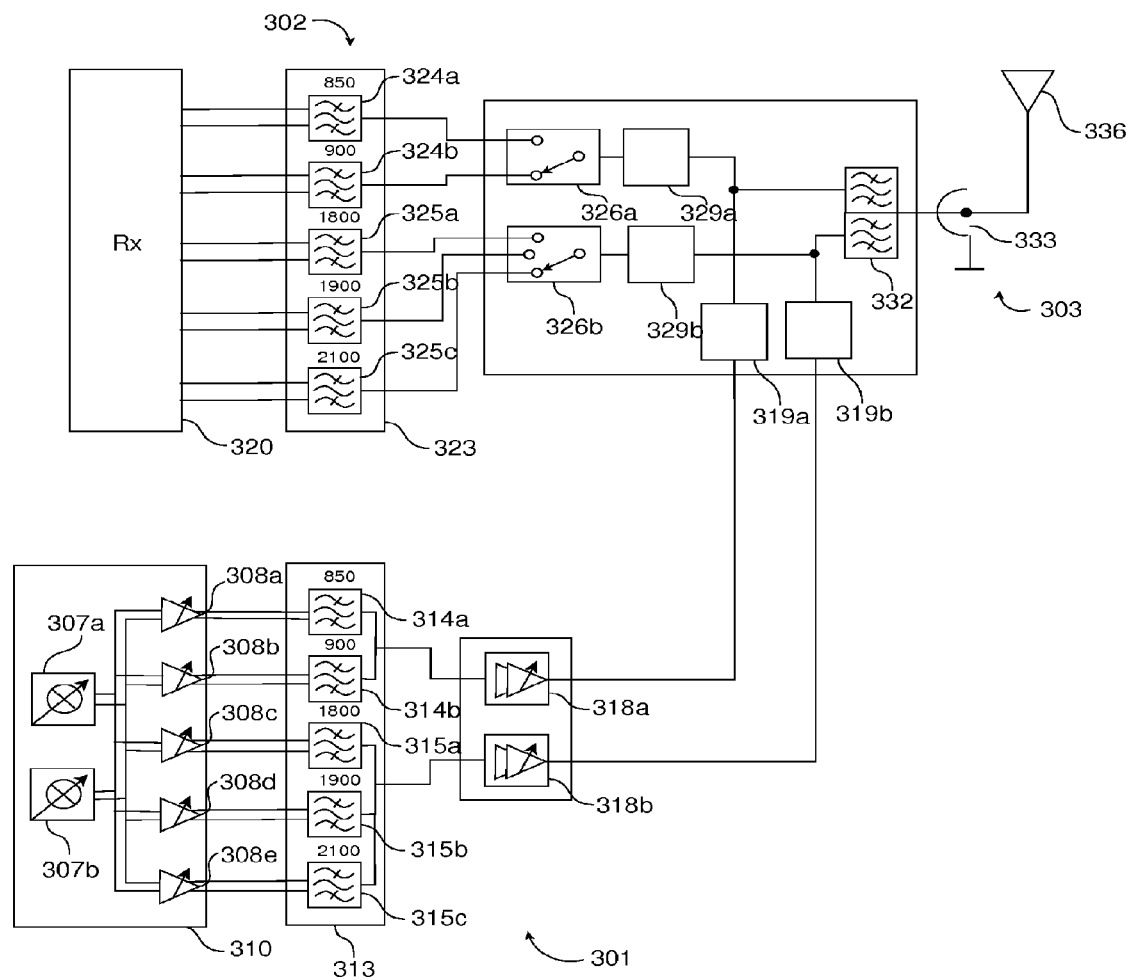
FIG. 3 shows a third embodiment with high-Q filters in a signal path to the antenna before the power amplifiers.

Like the first and second embodiments, the third embodiment (FIG. 3) encompasses a transmit circuitry portion 301, a receive circuitry portion 302 and a passive portion 303. In the third embodiment, the transmit circuitry portion 301 and the receive circuitry portion 302, for example, are essentially the same as the corresponding transmit circuitry portion 101 and as the corresponding receive circuitry portion 102, respectively, of the first embodiment.

The transmit circuitry portion 301 includes a transmitter 310 adapted to provide a signal in a predetermined and/or selected frequency band, a transmit bandpass filter bank 313, and power amplifiers 318a and 318b.

The passive portion 303 comprises tunable filters 319a and 319b, a diplex filter 332 and a port 341 to an antenna 336. Further, the passive portion 303 comprises receive tunable filters 329a and 329b, and switches 326a and 326b. The switches 326a and 326b are adapted to direct the receive signal path to the frequency band filter element of interest in the receive bandpass filter bank 323.

The receive portion 302 comprises a selective band filter bank 323 including selective band filter elements 324a, 324b, 325a, 325b, 325c each adapted to pass a signal in a different selected frequency band and to essentially suppress signals outside the selected frequency band, and a receiver 320.

A transmit signal path for all frequencies starts from the wide-band tunable modulation stages 207a, 207b and pre-amplifier 208 of transmitter 310 through the pre-power amplifier 211 to a frequency band filter element in the transmit bandpass filter bank 313. The transmit signal path for 850 MHz and 900 MHz frequencies then continues to the low-band power amplifier 318a, while the transmit path for the 1800 MHz, 1900 MHz and 2100 MHz frequencies continues to the high-band power amplifier 318b. The transmit signal path from the low-band power amplifier continues to the transmit tunable filter 319a while the transmit signal path from the high-band power amplifier 318b continues to the transmit tunable filter 319b.

The transmit signal path from the low-band power amplifier 318a continues to the transmit tunable filter 319a and further downstream to both the diplex filter 332 and the receive tunable filter 329a. The transmit signal path from the high-band power amplifier 318b continues to the transmit tunable filter 319b and further downstream to both the diplex filter 332 and the receive tunable filter 329b. From the diplex filter both the low-band and the high-band transmit signal paths continue via port 341 to the antenna 336.

The receive signal path for all frequencies starts at the antenna 336 and continues via port 341 to the diplex filter 332. From the diplex filter 332, a low-band frequency path continues to the receive tunable filter 329a and then on to the switch 326a. The switch 326a is adapted to direct a signal on the receive signal path to one of two connections 324a and 324b leading to the receive bandpass filter bank 323, i.e. to filters for 850 MHz frequencies and for 900 MHz frequencies, respectively. Downstream of the filter bank 323, the signal path proceeds to the receiver 320. A high-band frequency path from the diplex filter 332 continues to the receive tunable filter 329b and then on to the switch 326b. The switch 326b is adapted to direct a signal on the receive signal path to one of three connections 324c, 324d, 324e leading to the receive bandpass filter bank 323, i.e., to filters for 1800 MHz, 1900 MHz and 2100 MHz frequencies, respectively.

The arrangement of the third embodiment (FIG. 3) uses groups of frequency bands and a diplex filter 332 for attenuation, to achieve lower complexity and hence lower cost. No switch is used in the path from power amplifiers to antenna 336, given the grouping of frequencies, in this case high band group and low band group; instead, a simple diplex filter provides attenuation between the low group and the high group of frequencies. The high band corresponds to 1.8 to 2.1 GHz, while the low band is of the range 850-900 kHz. The transmitter 310 comprises two wide-band tunable modulation stages 307a, 307b, and pre-amplifiers 308a, 308b, 308c, 308d, 308e.

This allows a simplification of the filtering requirements, since only groups of frequencies need be considered by the tunable filters on the transmit 319a, 319b and receive 329a, 329b paths. The arrangement includes a diplex filter 332 to separate between the "high" group of frequencies and the "low" group of frequencies. However, the arrangement does not necessarily use any duplex filter. Yet, the arrangement maintains a separation between signals from the transmitter, destined for the antenna, and signals received from the antenna and destined for the receiver. Thus this arrangement requires no high-Q filter downstream of the power amplifier, and the diplex filter is sufficient to combine the outputs of the two power amplifiers 318a and 318b, which are fewer than the number of frequency bands in the plurality of frequency bands (850 MHz, 900 MHz, 1800 MHz, 1900 MHz and 2100 MHz).

Figure 4:
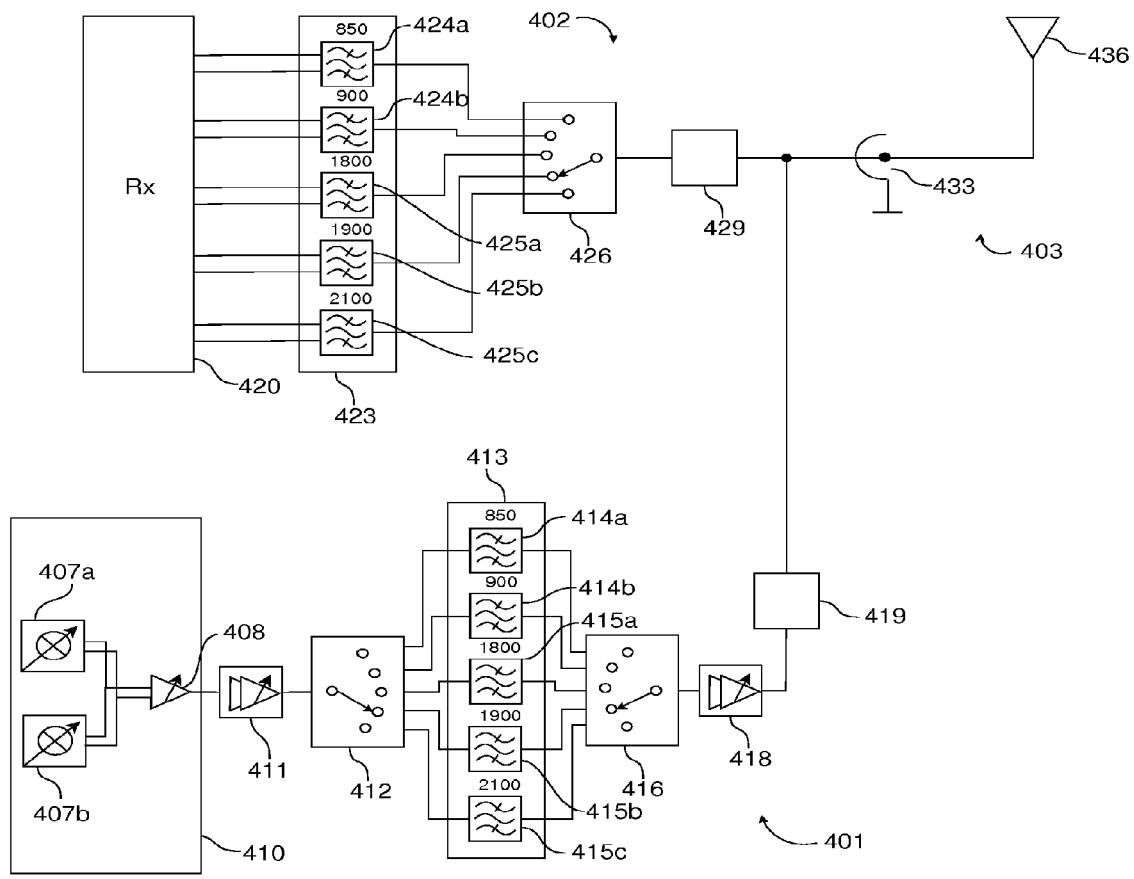
FIG. 4 shows a fourth embodiment with a single power amplifier and high-Q filters in a signal path to the antenna before the power amplifier.

The fourth embodiment (FIG. 4) comprises an arrangement with a power pre-amplifier. Like the embodiments discussed above, the fourth embodiment encompasses a transmit circuitry portion 401, a receive circuitry portion 402 and a passive portion 403.

The transmit circuitry portion 401 comprises a transmitter 410 with wide-band tunable modulation stages 407a, 407b and wideband pre-amplifier 408, power pre-amplifier 411, a switch 412, a transmit bandpass filter bank 413, a second switch 416, a power amplifier 418 and a tunable filter 419. The receive circuitry portion 402 comprises a receive tunable filter 429, a receive switch 426, a receive filter bank 423 and a receiver 420. The passive portion 403 comprises a port 433 to an antenna 436.

The transmit signal path is from the wide-band tunable modulation stages 407a, 407b of transmitter 410 to pre-amplifier 408 and then to pre-amplifier 411 followed by switch 412 which is adapted to direct the transmit signal to a filter element 414 in the transmit selective band filter bank 413. Downstream of the selective band filter bank 413, the signal path passes through a second switch 416, which is adapted to select an output signal of the filter element 414 and direct that output signal to the power amplifier 418. From the power amplifier 418 the signal path passes through tunable filter 419 and continues on to both antenna 436 and receive tunable filter 429. The receive signal path starts at the antenna 436, and continues to the receive tunable filter 429 and on to the receive switch 426. The receive switch 426 is adapted to direct the signal to a filter element 424 in the receive filter bank 423. From the receive filter bank 423, the signal path continues to the receiver 420.

In the arrangement of the fourth embodiment (FIG. 4) use of the power pre-amplifier 411 allows the use of switches 412 and 416 in the transmit path without having any switch being located between the power amplifier 418 and the antenna 436. In particular, because of a signal's pre-amplification, the power amplifier 418 needs less gain and, consequently, does not introduce so much noise as to require additional filtering of an amplified signal. Low-Q filters 419, 429 are used in both the transmit and the receive paths to provide suitable attenuation of the transmitted signal at the receiver. Band selection is done in the filter elements 414a, 414b, 415a, 415b, 415c between the power pre-amplifier 411 and the power amplifier 418. In this implementation, a single power pre-amplifier 411 and a single power amplifier 418 are used. In a variant of the fourth embodiment, more than a single power pre-amplifier and/or more than a single power amplifier could be used. The multiple power pre-amplifiers and/or the multiple power amplifiers could be arranged sequentially in the signal path and/or in parallel wherein the multiple amplifiers would be adapted to amplify a signal within a predetermined frequency band. Due to the reduced amplification of each stage, the linearity requirements are reduced, which in a variant of the fourth embodiment, leads to reduced power consumption.

The fourth embodiment uses no duplex filters in the signal path downstream of the power amplification stage. The absence of duplex filters in turn makes it possible to direct signals of any frequency band to the common power amplifier or set of power amplifiers, which has advantages of simple design, improved power efficiency, and thereby reduced cost. The design also benefits from having the power amplifier or amplifiers after the frequency band selection switches, which reduces the requirements on the switches for current-carrying capacity.

In the fourth embodiment the final power amplification stage has significantly less than 30 dB gain. The power amplifier 418 has a gain of, for example in the range of 10 dB. When compared to a power amplifier in a conventional design of similar functionality, the gain of power amplifier 418 is comparatively low. The low gain of the power amplifier 418 is made possible by the contribution of the transmit power pre-amplifier 411, means that there is no high-Q filter needed in the transmit signal path downstream of the power amplifier 418. Selective switching of the frequency band means that there are less power amplifiers than there are frequency bands, for example, in the fourth embodiment there is one power amplifier 418, which is fewer than the number of frequency bands in the plurality of frequency bands. The effect of these measures is to reduce the complexity of the complete arrangement.

Figure 5:
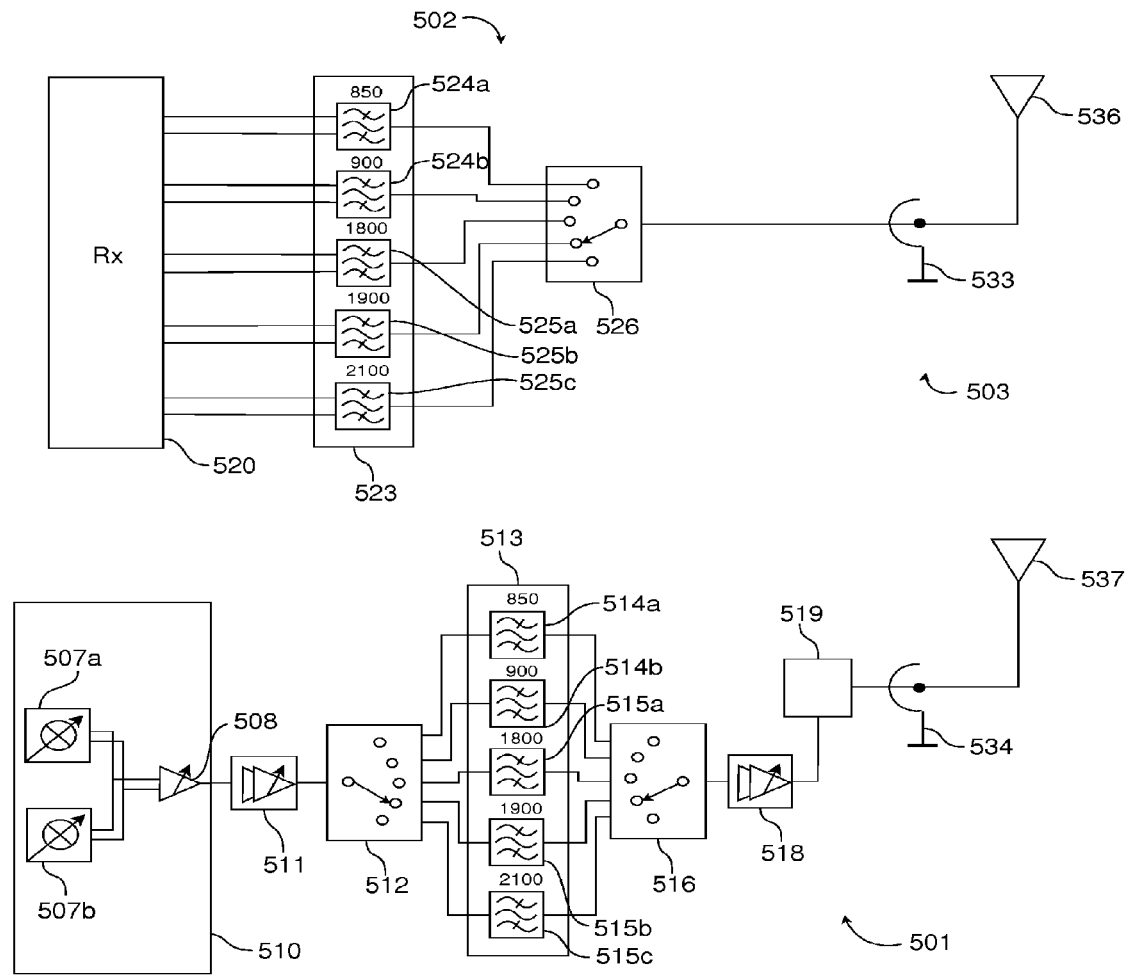
FIG. 5 shows a fifth embodiment with separate transmit and receive antennas.

The fifth embodiment is presented in FIG. 5. Like the previously disclosed embodiments, the fifth embodiment encompasses a transmit circuitry portion 501 and a receive circuitry portion 502, but unlike the previously disclosed embodiments that encompass a single passive portion, the fifth embodiment encompasses two passive portions, namely a transmit passive portion 504 and a receive passive portion 503.

The transmit circuitry 501 comprises a transmitter 510 with wide-band tunable modulation stages 507a, 507b and pre-amplifier 508, a pre-power amplifier 511 and a switch 512. It also comprises selective band filter element 514a, 514b, 515a, 515b, 515c of a transmit selective band filter bank 513, a switch 516, a power amplifier and a tunable filter 519. The transmit passive portion 504 comprises a transmit antenna connection 534 adapted to connect to a transmit antenna 537.

The transmit signal path starts at the transmitter 510 with wide-band tunable modulation stages 507a, 507b and pre-amplifier 508, and continues downstream to the pre-power amplifier 511 and then to a switch 512. The switch 512 is adapted to direct a transmit signal to one of the filter elements 514a, 514b, 515a, 515b, 515c of the transmit filter bank 513 adapted to pass a frequency band used by the transmit signal. From the filter element 514 the transmit signal path passes to downstream switch 516 which is adapted to direct the transmit signal to the power amplifier 518. From the power amplifier 518 the signal path passes downstream to tunable filter 519 and then via antenna connection 534 to transmit antenna 537.

The receive circuitry 502 comprises a switch 526, and a receive filter bank 523 including filter elements 524a, 524b, 525a, 525b, 525c, as well as a receiver 520. The receive passive circuitry portion 503 comprises receive antenna connection 533 adapted to connect to receive antenna 536 (distinct from the transmit antenna 537). In a variant of the fifth embodiment, both the transmit antenna connection 534 and the receive antenna connection 533 are adapted to be connected to a single antenna that may include matching elements in the transmit signal path and/or in the receive signal path.

The receive signal path begins at the receive antenna 536 and continues to switch 526. The switch 526 is adapted to direct the receive signal to one of the filter elements 524a, 524b, 525a, 525b, 525c in the receive filter bank 523. From the filter bank 523 the signal path passes downstream to the receiver 520.

The arrangement of the fifth embodiment (FIG. 5) presents an alternate configuration with two separate and distinct signal paths where, in operation, the transmit signal goes to the transmit antenna 537 and the receive signal is taken from the receive antenna 536, as compared to the shared passive portion including a shared antenna port in the first four embodiments. The attenuation achieved by using separate antennas or, at least, separate transmit signal path and receive signal path including the respective antenna ports or antenna connections 534, 533, can be used to reduce the quality requirements on the low-Q filters, and in a variant of the instant embodiment to eliminate the filter present in the receive path from antenna 536 to receiver 520 of other embodiments. The total attenuation in this embodiment is 20 dB, with 10 dB coming from the low-Q filter 519, and 10 dB from the separation between transmit antenna connection 534 and receive antenna portion 533.

The low gain of the power amplifier 518, made possible by the contribution of the transmit pre-power amplifier 511, means that there is no high-Q filter downstream of the power amplifier 518. Selective switching of the frequency band means that there is only one power amplifier 518, which is fewer than the number of frequency bands in the plurality of frequency bands. The effect of these measures is to reduce the complexity of the complete arrangement.

In the above description, embodiments have been shown and described enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that embodiments described in combination with specific entities may in addition to an implementation in these entity also include one or more implementations in one or more sub-entities or sub-divisions of said described entity. For example, specific embodiments described herein described herein to be implemented in a transmitter, receiver or transceiver may be implemented in sub-entities such as a chip or a circuit provided in such an entity.

The accompanying drawings that form a part hereof show by way of illustration, and not of limitation, specific embodiments in which the subject matter may be practiced.

In the foregoing Detailed Description, in some instances various features are described grouped together in a single embodiment. This is not to be interpreted such that the claimed embodiments require more features than are expressly recited in each claim. Rather, as the following claims reflect, inventive subject matter can lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim.

It is further to be noted that methods disclosed in the specification or in the claims may be implemented by a device having means for performing each of the respective steps of these methods.

What is claimed is:

1. A multiband radio-frequency (RF) device comprising:
a modulator circuit configured to receive a baseband signal and modulate a RF signal with the baseband signal to provide a first RF signal;
a pre-amplifier circuit configured to amplify the first RF signal to provide a second RF signal;
a transmit bandpass filter bank configured to remove signals outside a predetermined frequency band from the second RF signal to provide a third RF signal;
a power amplifier circuit configured to apply moderate amplification to the third RF signal to provide a fourth RF signal, the power amplifier circuit comprising a plurality of power amplifiers each configured to provide the fourth RF signal in response to reception of the third RF signal, and multiple power amplifiers are each connected with a different plurality of bandpass filters and free from connection to remaining bandpass filters;
a low-Q filter configured to receive the fourth RF signal and provide a fifth RF signal to an antenna connection; and
a reception processing path configured to couple to the antenna connection, the reception processing path comprising:
a receiver configured to receive a reception RF signal with one of a plurality of frequency bands; and
a receive bandpass filter bank configured to receive a second RF reception signal associated with a second predetermined frequency band and to remove signals outside the second predetermined frequency band from the second RF reception signal to provide the RF reception signal to the receiver,
wherein the transmit bandpass filter bank comprises a plurality of transmit bandpass filter sets and the receive bandpass filter bank comprises a plurality of receive bandpass filter sets, each transmit bandpass filter set is connected with a different one of the power amplifiers, and each transmit bandpass filter set has a corresponding receive bandpass filter set such that each transmit bandpass filter set and corresponding receive bandpass filter set filter RF signals in a same bandwidth range that is respectively different than and non-overlapping with the bandwidth range of each transmit bandpass filter set and corresponding receive bandpass filter set.

2. The multiband RF device of claim 1, wherein the low-Q filter includes a tunable low-Q filter.

3. The multiband RF device of claim 2, including a switch configured to couple an output of the pre-amplifier circuit with one of a plurality of inputs of the transmit bandpass filter bank.

4. The multiband RF device of claim 3, including a second switch configured to couple one of a plurality of outputs of the transmit bandpass filter bank with an input of the power amplifier.

5. The multiband RF device of claim 2, wherein the pre-amplifier circuit includes a single wide band pre-amplifier.

6. The multiband RF device of claim 2, wherein the pre-amplifier circuit includes a plurality of pre-amplifiers, each pre-amplifier of the plurality of pre-amplifiers configured to handle a single distinct frequency band of the multiband radio-frequency (RF) device.

7. The multiband RF device of claim 2, wherein the low-Q filter includes a diplex filter.

8. The multiband device of claim 1, including a circulator configured to couple the reception processing path to the antenna connection.

9. The multiband device of claim 8, wherein the power amplifier circuit is coupled to the antenna connection through the circulator.

10. The multiband device of claim 9, including a reception switch configured to couple an output of the circulator with one input of a plurality of inputs of the receive bandpass filter bank.

11. The multiband RF device of claim 1, wherein amplification applied by the power amplifier circuit is dependent on whether a switch is disposed between the power amplifier circuit and the antenna connection.

12. The multiband RF device of claim 1, wherein amplification applied by the power amplifier circuit is dependent on the Q-factor of the low-Q filter.

13. A method of operating a multiband radio-frequency (RF) device, the method comprising:
   receiving a baseband signal at a modulator circuit of the multiband RF device;
   modulating an RF signal with the baseband signal using the modulator circuit to provide a first RF signal;
   amplifying the first RF signal using a pre-amplifier circuit to provide a second RF signal;
   removing signals outside a predetermined frequency band from the second RF signal using a transmit bandpass filter bank to provide a third RF signal;
   applying moderate amplification to the third RF signal using a power amplifier circuit to provide a fourth RF signal, wherein a gain of the power amplifier circuit is less than an overall transmit gain, the power amplifier circuit comprising a plurality of power amplifiers each configured to provide the fourth RF signal in response to reception of the third RF signal, and multiple power amplifiers are each connected with a different plurality of bandpass filters and free from connection to remaining bandpass filters;
   filtering the fourth RF signal using a low-Q filter to provide a fifth RF signal to an antenna connection,
   receiving a reception RF signal with one of a plurality of frequency bands using a receiver within a reception processing path of the multi band RF device, the receiver coupled to the antenna connection;
   receiving a second RF reception signal associated with a second predetermined frequency band at a receive bandpass filter bank; and
   removing signals outside the second predetermined frequency band from the second RF reception signal to provide the RF reception signal to the receiver,
   wherein the transmit bandpass filter bank comprises a plurality of transmit bandpass filter sets and the receive bandpass filter bank comprises a plurality of receive bandpass filter sets, each transmit bandpass filter set is connected with a different one of the power amplifiers, and each transmit bandpass filter set has a corresponding receive bandpass filter set such that each transmit bandpass filter set and corresponding receive bandpass filter set filter RF signals in a same bandwidth range that is respectively different than and non-overlapping with the bandwidth range of each transmit bandpass filter set and corresponding receive bandpass filter set.

14. The method of claim 13, including coupling an output of the pre-amplifier circuit with one of a plurality of inputs of the transmit bandpass filter bank using including a first switch.

15. The method of claim 14, including coupling one of a plurality of outputs of the transmit bandpass filter bank with an input of the power amplifier using a second switch.

16. The method of claim 15, including coupling the reception processing path to the low-Q filter using a circulator.

17. The method of claim 16, wherein the low-Q filter is a diplex filter.

18. A transmitter and receiver arrangement configured for full-duplex operation in a plurality of Universal Mobile Telecommunications System (UMTS) frequency bands, comprising:
   a wideband tunable modulation stage adapted for providing signals over the plurality of UMTS frequency bands;
   a first filter comprising frequency selective elements selective for each of the plurality of UMTS frequency bands to receive a transmission signal from the wide-band tunable modulation stage and to provide a first filtered signal;
   a power amplifier stage adapted to receive the first filtered signal, the power amplifier stage comprising a plurality of power amplifiers each configured to provide the fourth RF signal in response to reception of the third RF signal, and multiple power amplifiers are each connected with a different plurality of bandpass filters and free from connection to remaining bandpass filters;
   a low-Q filter configured to receive the output of the power amplifier stage and provide a second filtered signal to an antenna connection; and
   a reception processing path configured to couple to the antenna connection, the reception processing path comprising:
      a receiver configured to receive a reception RF signal with one of a plurality of frequency bands; and
      a receive bandpass filter bank configured to receive a second RF reception signal associated with a second predetermined frequency band and to remove signals outside the second predetermined frequency band from the second RF reception signal to provide the RF reception signal to the receiver,
   wherein the transmit bandpass filter bank comprises a plurality of transmit bandpass filter sets and the receive bandpass filter bank comprises a plurality of receive bandpass filter sets, each transmit bandpass filter set is connected with a different one of the power amplifiers, and each transmit bandpass filter set has a corresponding receive bandpass filter set such that each transmit bandpass filter set and corresponding receive bandpass filter set filter RF signals in a same bandwidth range that is respectively different than and non-overlapping with the bandwidth range of each transmit bandpass filter set and corresponding receive bandpass filter set.

19. The transmitter and receiver arrangement of claim 18, wherein the number power amplifiers in the final power amplifier stage is fewer than the number of frequency bands in the plurality of frequency bands.

* * * * *